(12) United States Patent
Chen et al.

(10) Patent No.: US 6,849,876 B1
(45) Date of Patent: Feb. 1, 2005

(54) LIGHT EMITTING DEVICE

(75) Inventors: An-Si Chen, Taichung (TW); Cheng-Hsiung Kuo, Taichung Hsien (TW)

(73) Assignee: Excel Cell Electronic Co., Ltd., Taichung (TW)

( * ) Notice: Subject to any disclaimer, the term of this patent is extended or adjusted under 35 U.S.C. 154(b) by 0 days.

(21) Appl. No.: 10/858,529

(22) Filed: May 31, 2004

(51) Int. Cl.[7] .......................... H01L 27/15; H01L 31/12
(52) U.S. Cl. ............................ 257/81; 257/88; 257/99
(58) Field of Search ............................. 257/79, 81, 88, 257/99–100, 676

(56) References Cited

U.S. PATENT DOCUMENTS 6,700,138 B2 * 3/2004 Crane et al. .................. 257/99

2004/0164311 A1 * 8/2004 Uemura ....................... 257/99

* cited by examiner

*Primary Examiner*—Phat X. Cao
*Assistant Examiner*—Theresa T. Doan
(74) *Attorney, Agent, or Firm*—Christie, Parker & Hale, LLP

(57) ABSTRACT

A light emitting device includes a conductive base that is formed with a through-hole defined by a hole-defining wall, a conductive first lead extending downwardly from the base, an LED die mounted on the base and connected electrically to the first lead, a conductive wire, a conductive second lead spaced apart from the first lead, extending into the through-hole and cooperating with the hole-defining wall to define a gap therebetween, and connected electrically to the LED die through the conductive wire, and a dielectric material filled in the gap.

10 Claims, 7 Drawing Sheets

LIGHT EMITTING DEVICE

BACKGROUND OF THE INVENTION

1. Field of the Invention

This invention relates to a light emitting device, more particularly to a light emitting device configured for enhanced heat dissipation.

2. Description of the Related Art

Conventional light emitting devices normally include a metal frame for mounting of an LED (light emitting diode) die (or a plurality of LED dies) thereon, and a transparent enclosure that encloses an upper part of the metal frame and the LED die. Since heat is generated upon activation of the LED die(s), the LED die(s) may be damaged as a result of a large amount of heat accumulated inside the transparent enclosure. As such, there is a need for effectively dissipating the heat generated by the LED die(s).

SUMMARY OF THE INVENTION

The object of the present invention is to provide a light emitting device configured for enhanced heat dissipation.

According to this invention, a light emitting device comprises: a conductive die-mounting base that has opposite upper and lower surfaces and that is formed with at least one through-hole extending through the upper and lower surfaces and defined by a hole-defining wall, and a conductive first lead extending downwardly from the lower surface; at least one LED die mounted on the upper surface of the die-mounting base and connected electrically to the first lead through the die-mounting base; at least one conductive wire; a conductive second lead spaced apart from the first lead and having an upper end that extends into the through-hole and that cooperates with the hole-defining wall to define a gap therebetween, and a lower end that extends downwardly and outwardly of the through-hole from the upper end, the second lead being connected electrically to the LED die through the conductive wire; and a dielectric material filled in the gap for insulating electrically the second lead from the die-mounting base and for conducting heat generated by the LED die during activation of the LED die through the die-mounting base, the dielectric material, and the second lead, thereby enhancing heat dissipation of the LED die.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
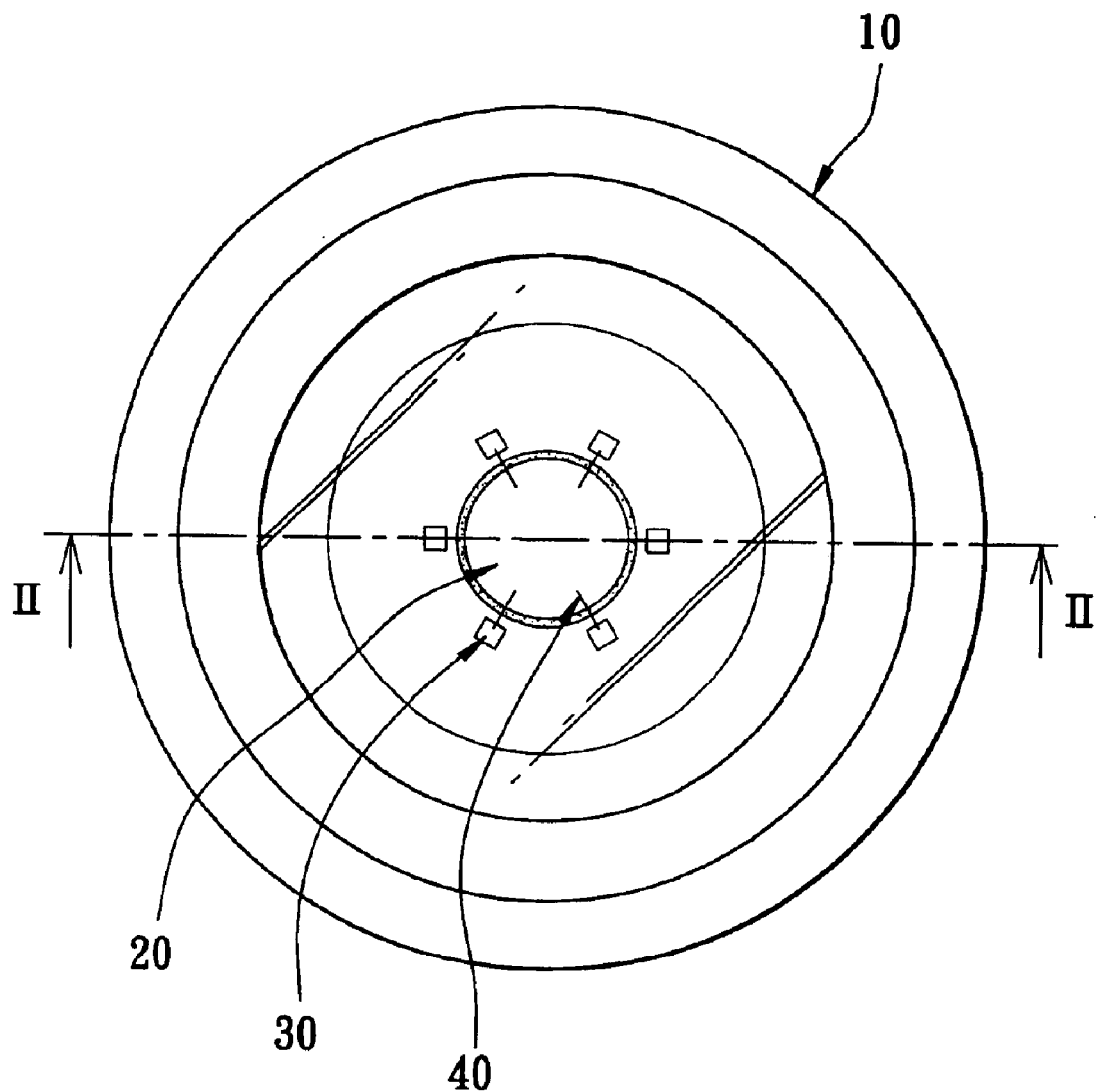
FIG. 1 is a schematic top view of the first preferred embodiment of a light emitting device according to this invention.

For the sake of brevity, like elements are denoted by the same reference numerals throughout the disclosure.

Figure 2:
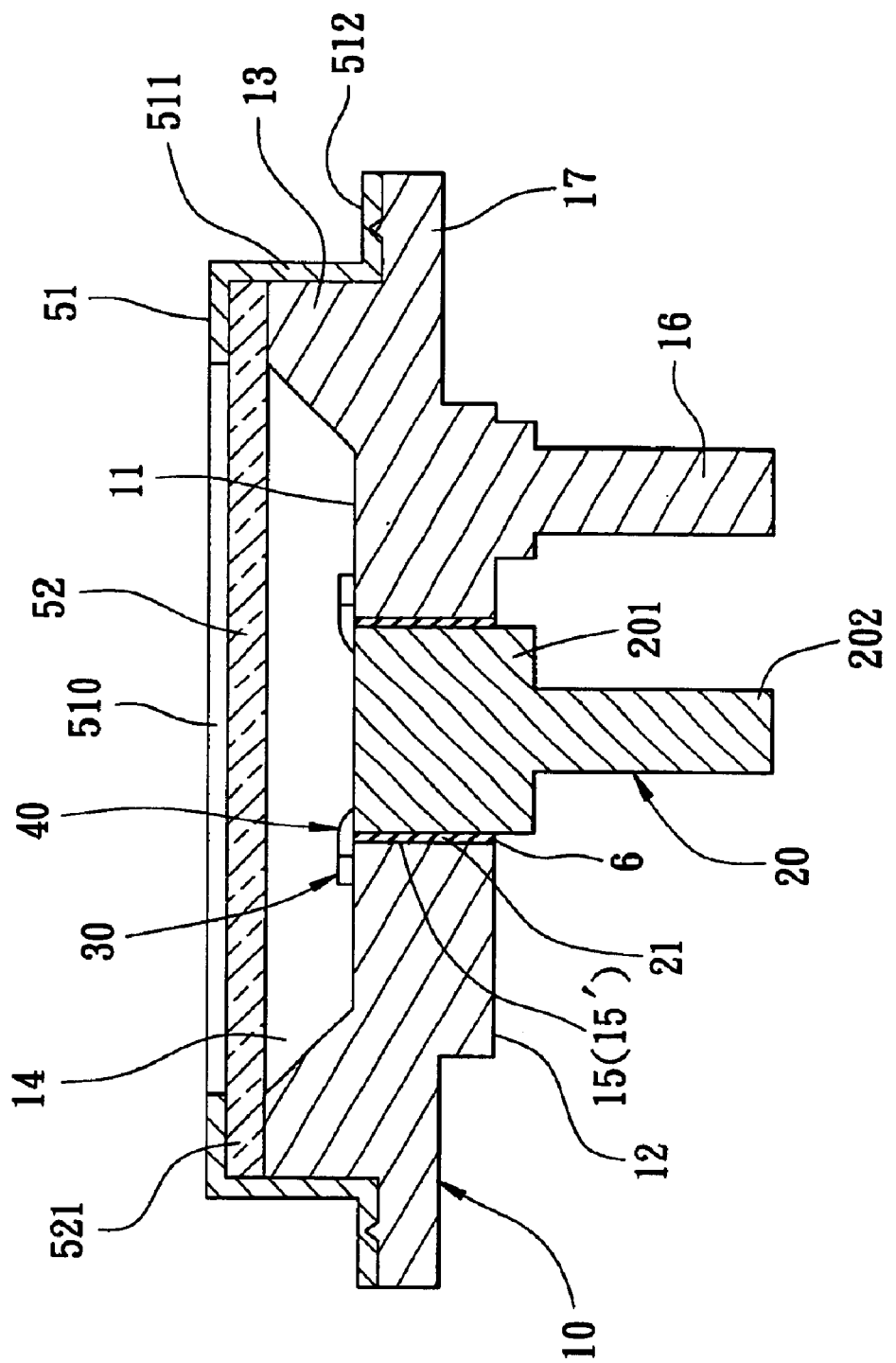
FIG. 2 is a sectional view taken along lines II—II in FIG. 1.

FIGS. 1 and 2 illustrate the first preferred embodiment of a light emitting device according to this invention. The light emitting device includes: a conductive die-mounting base 10 that has opposite upper and lower surfaces 11, 12 and that is formed with at least one through-hole 15 extending through the upper and lower surfaces 11, 12 and defined by a hole-defining wall 15', and a conductive first lead 16 extending downwardly from the lower surface 12; at least one LED die 30 mounted on the upper surface 11 of the die-mounting base 10 and connected electrically to the first lead 16 through the die-mounting base 10; at least one conductive wire 40; a conductive second lead 20 spaced apart from the first lead 16 and having an upper end 201 that extends into the through-hole 15 and that cooperates with the hole-defining wall 15' to define a gap 6 therebetween, and a lower end 202 that extends downwardly and outwardly of the through-hole 15 from the upper end 201, the second lead 20 being connected electrically to the LED die 30 through the conductive wire 40; and a dielectric material 21 filled in the gap 6 for insulating electrically the second lead 20 from the die-mounting base 10 and for conducting heat generated by the LED die 30 during activation of the LED die 30 through the die-mounting base 10, the dielectric material 21, and the second lead 20, thereby enhancing heat dissipation of the LED die 30. Preferably, the dielectric material 21 is made from a high thermal conductive material.

Configuration of the die-mounting base 10 and connection of the second lead 20 to the die-mounting base 10 (or intersecting of the second lead 20 with the die-mounting base 10) are advantageous in that the size of the light emitting device can be reduced as compared to the conventional light emitting devices which have the second lead separated from the die-mounting base 10.

In this embodiment, the light emitting device includes a plurality of LED dies 30 that are equiangularly disposed around a periphery of the through-hole 15. The second lead 20 is cylindrical in shape. The upper end 201 of the second lead 20 is radially enlarged from the lower end 202 of the second lead 20.

The die-mounting base 10 is formed with a depression 14 that is indented inwardly from the upper surface 11 of the die-mounting base 10, and has a rim portion 13 that surrounds the depression 14. Each of the LED dies 30 is disposed in the depression 14. The through-hole 15 is in spatial communication with and intersects the depression 14. An insulating transparent cover 52 has a peripheral edge 521 seated on the rim portion 13 to cover the depression 14.

The die-mounting base 10 is further formed with a flange 17 that extends outwardly and laterally from the rim portion 13. A retaining cap 51 has a crown portion 511 seated on and connected securely to the peripheral edge 521 of the transparent cover 52 and surrounding and contacting the rim portion 13 of the die-mounting base 10, and a brim portion 512 extending laterally and outwardly from the crown portion 511 and seated on the flange 17 of the die-mounting base 10 so as to retain the cover 52 on the die-mounting base 10. The crown portion 511 of the retaining cap 51 is formed with a central opening S10 for passage of light emitted by the LED dies 30 through the transparent cover 52.

Figure 3:
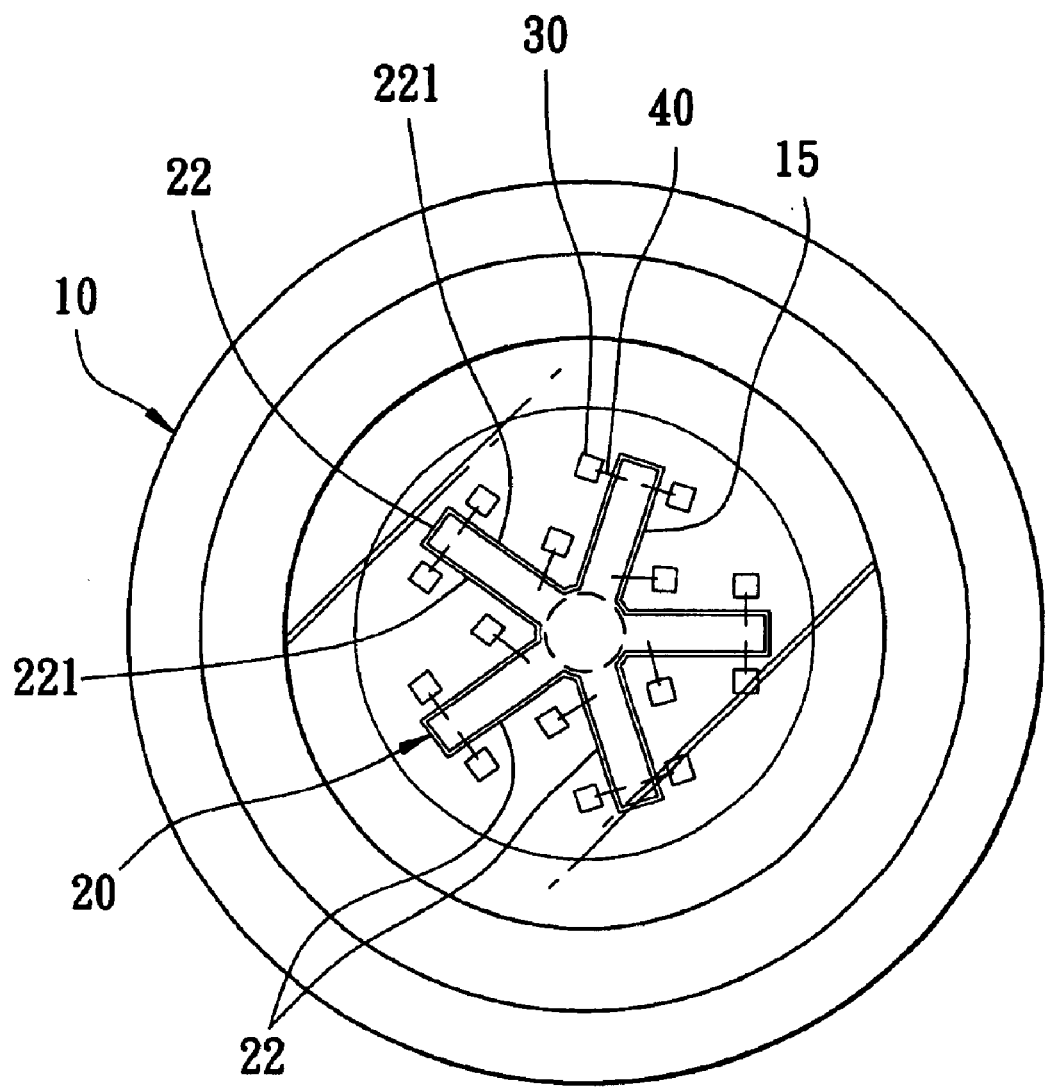
FIG. 3 is a schematic top view of the second preferred embodiment of the light emitting device according to this invention.

FIG. 3 illustrates the second preferred embodiment of the light emitting device according to this invention. The light emitting device is similar to the previous embodiment, except that the second lead 20 is star-like in shape, and includes a plurality of radial terminals 22, each of which has two opposite sides 221. Each of the LED dies 30 is disposed adjacent to and is connected electrically to a respective one of the opposite sides 221 of a respective one of the terminals 22 through the respective one of the conductive wires 40.

Figure 4:
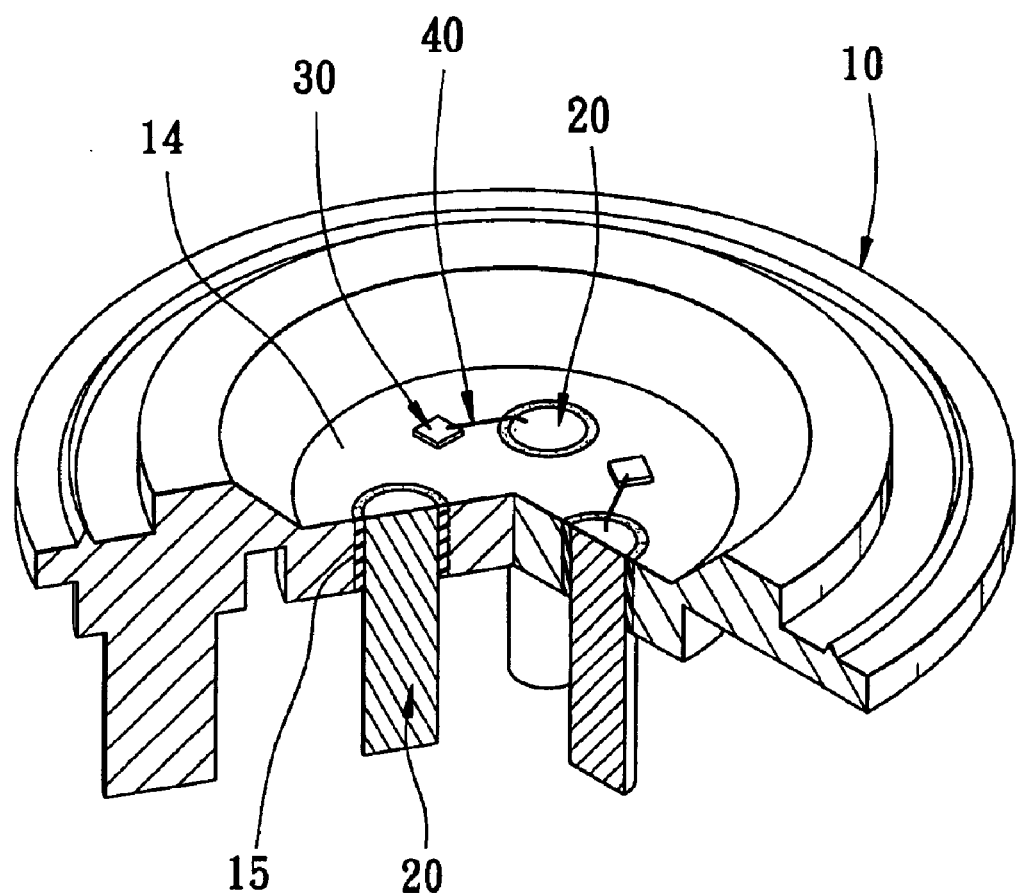
FIG. 4 is a partly cutaway, fragmentary perspective view of the third preferred embodiment of the light emitting device according to this invention.

FIG. 4 illustrates the third preferred embodiment of the light emitting device according to this invention. The light emitting device is similar to the first embodiment, except that the die-mounting base 10 is formed with a plurality of through-holes 15 and that the light emitting device includes a plurality of second leads 20, each of which extends into a respective one of the through-holes 15, and a plurality of LED dies 30, each of which is connected electrically to a respective one of the second leads 20 through a respective one of the conductive wires 40. Each of the through-holes 15 is in spatial communication with and intersects the depression 14.

Figure 5:
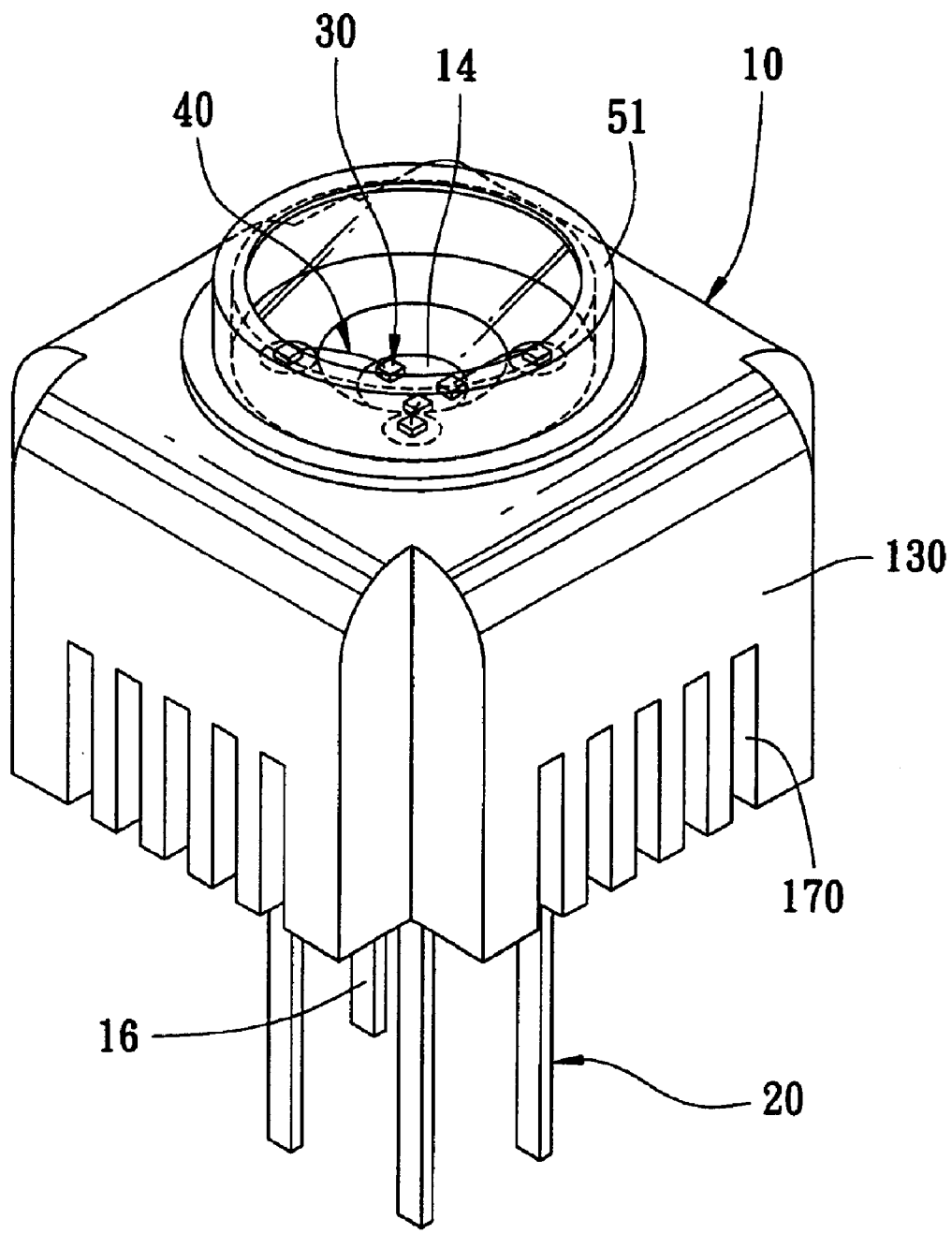
FIG. 5 is a perspective view of the fourth preferred embodiment of the light emitting device according to this invention.
Figure 6:
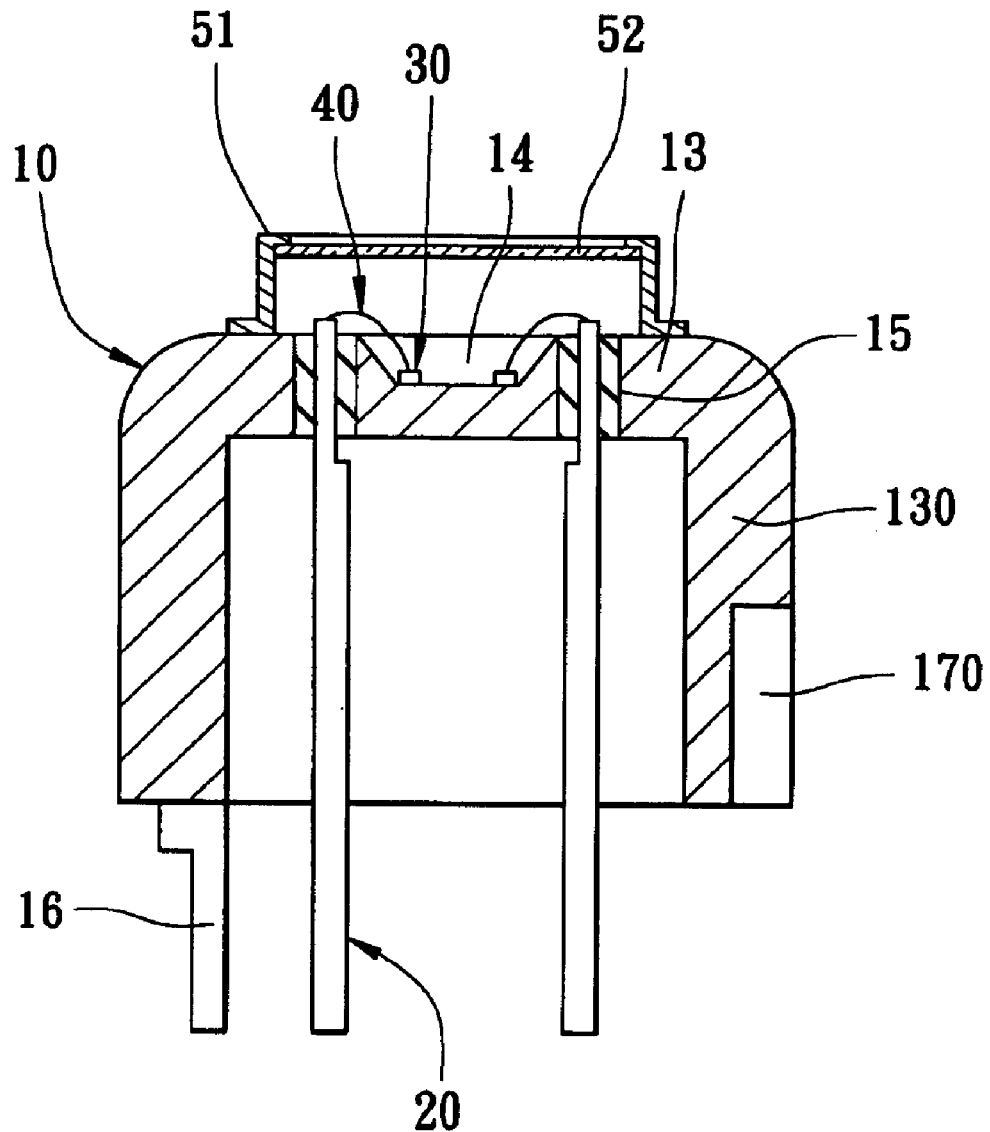
FIG. 6 is a sectional view of the fourth preferred embodiment.

FIGS. 5 and 6 illustrate the fourth preferred embodiment of the light emitting device according to this invention. The light emitting device is similar to the first embodiment, except that the die-mounting base 10 further has a surrounding wall portion 130 extending downwardly from the rim portion 13 for enhancing heat dissipation, and that each of the through-holes 15 is formed in the rim portion 13 of the die-mounting base 10, and is offset from the depression 14. Preferably, the surrounding wall portion 130 of the die-mounting base 10 is formed with a plurality of grooves 170 for increasing heat dissipating area thereof.

Figure 7:
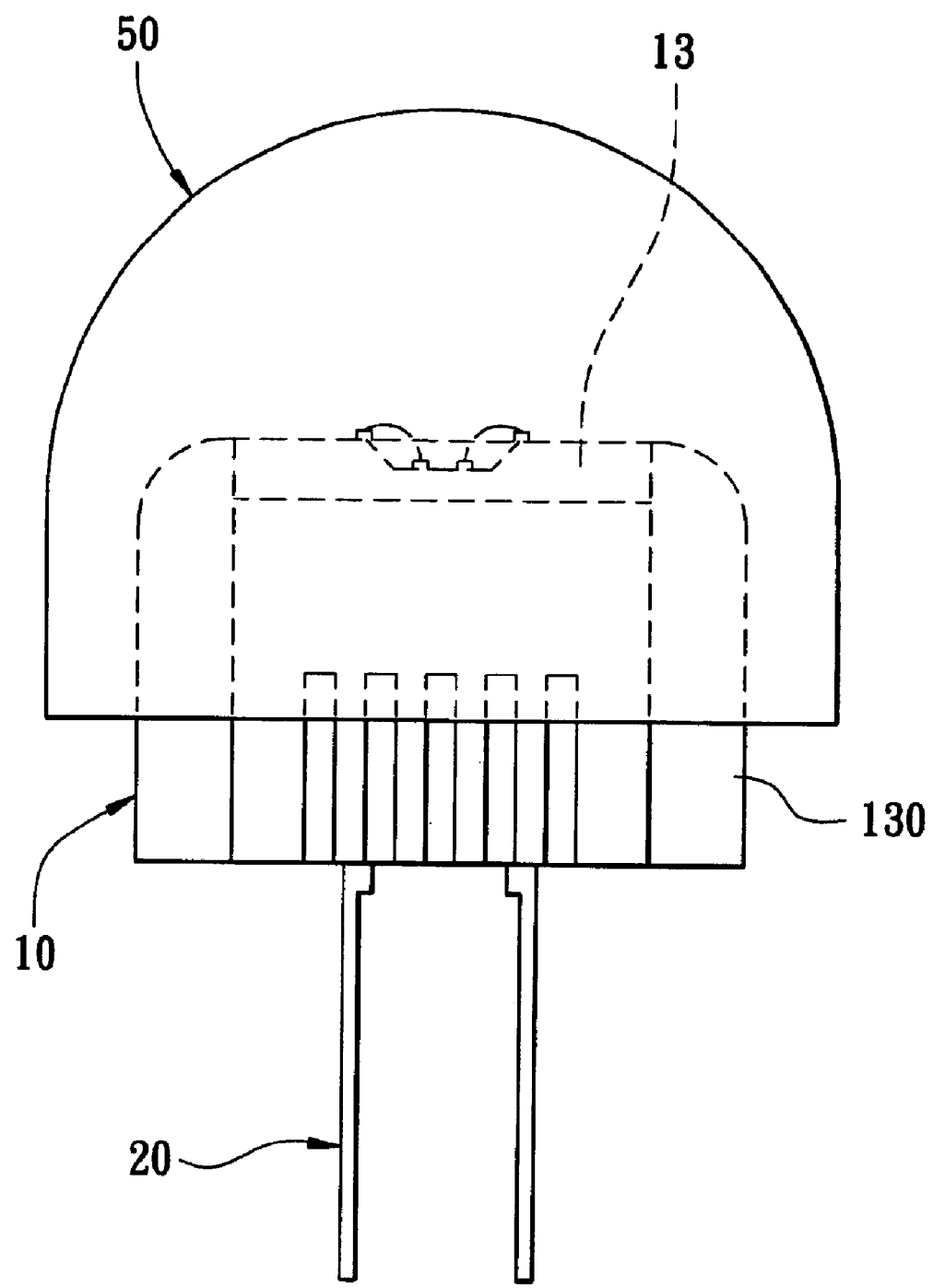
FIG. 7 is a schematic side view of the fifth preferred embodiment of the light emitting device according to this invention.

FIG. 7 illustrates the fifth preferred embodiment of the light emitting device according to this invention. The light emitting device is similar to the fourth embodiment, except that a transparent resin enclosure 50 is provided instead of the assembly of the retaining cap 51 and the transparent cover 52 to enclose the rim portion 13 of the die-mounting base 10.

The direct connection between the second lead 20 and the die-mounting base 10 of the light emitting device of this invention enhances heat dissipation of the LED die(s) 30 as compared to the aforesaid conventional light emitting devices. In addition, the configuration of the assembly of the die-mounting base 10 and the second lead(s) 20 can reduce the size of the light emitting device as compared to the conventional light emitting devices having the second leads separated from the die-mounting base.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

We claim:

1. A light emitting device comprising:
    a conductive die-mounting base that has opposite upper and lower surfaces and that is formed with at least one through-hole extending through said upper and lower surfaces and defined by a hole-defining wall, and a conductive first lead extending downwardly from said lower surface;
    at least one LED die mounted on said upper surface of said die-mounting base and connected electrically to said first lead through said die-mounting base;
    at least one conductive wire;
    a conductive second lead spaced apart from said first lead and having an upper end that extends into said through-hole and that cooperates with said hole-defining wall to define a gap therebetween, and a lower end that extends downwardly and outwardly of said through-hole from said upper end, said second lead being connected electrically to said LED die through said conductive wire; and
    a dielectric material filled in said gap for insulating electrically said second lead from said die-mounting base and for conducting heat generated by said LED die during activation of said LED die through said die-mounting base, said dielectric material, and said second lead, thereby enhancing heat dissipation of said LED die.

2. The light emitting device of claim 1, wherein said die-mounting base is formed with a depression that is indented inwardly from said upper surface, and has a rim portion that surrounds said depression, said LED die being disposed in said depression, said light emitting device further comprising an insulating transparent cover that has a peripheral edge seated on said rim portion to cover said depression.

3. The light emitting device of claim 2, wherein said die-mounting base is further formed with a flange that extends outwardly and laterally from said rim portion, said light emitting device further comprising a retaining cap that has a crown portion seated on and connected securely to said peripheral edge of said transparent cover and surrounding and contacting said rim portion of said die-mounting base, and a brim portion extending laterally and outwardly from said crown portion and seated on said flange of said die-mounting base, said crown portion of said retaining cap being formed with a central opening for passage of light emitted by said LED die through said transparent cover.

4. The light emitting device of claim 2, wherein said through-hole is in spatial communication with and intersects said depression.

5. The light emitting device of claim 2, wherein said through-hole is formed in said rim portion of said die-mounting base, and is offset from said depression.

6. The light emitting device of claim 2, wherein said die-mounting base further has a surrounding wall portion that extends downwardly from said rim portion for enhancing heat dissipation.

7. The light emitting device of claim 6, wherein said surrounding wall portion of said die-mounting base is formed with a plurality of grooves for increasing heat dissipating area thereof.

8. A light emitting device comprising:
    a conductive die-mounting base that has opposite upper and lower surfaces and that is formed with a through-hole extending through said upper and lower surfaces and defined by a hole-defining wall, and a conductive first lead extending downwardly from said lower surface;
    a plurality of LED dies attached directly to said upper surface of said die-mounting base and connected electrically to said first lead through said die-mounting base;
    a plurality of conductive wires;
    a conductive second lead spaced apart from said first lead and having an upper end that extends into said through-hole and that cooperates with said hole-defining wall to define a gap therebetween, each of said LED dies being connected electrically to said second lead through a respective one of said conductive wires; and a dielectric material filled in said gap for insulating electrically said second lead from said die-mounting base and for conducting heat generated by said LED dies during activation of said LED dies through said die-mounting base, said dielectric material, and said second lead, thereby enhancing heat dissipation of said LED dies.

9. The light emitting device of claim 8, wherein said second lead is cylindrical in shape, said LED dies being disposed around a periphery of said through-hole.

10. The light emitting device of claim 8, wherein said second lead is star-like in shape, and includes a plurality of radial terminals, each of which has two opposite sides, each of said LED dies being disposed adjacent to and being connected electrically and directly to a respective one of said opposite sides of a respective one of said terminals through the respective one of said conductive wires.

* * * * *